United States Patent
Narayanan et al.

(10) Patent No.: US 6,171,721 B1
(45) Date of Patent: Jan. 9, 2001

(54) SPUTTER-DEPOSITED FUEL CELL MEMBRANES AND ELECTRODES

(75) Inventors: Sekharipuram R. Narayanan, Altadena; Barbara Jeffries-Nakamura, St. Marino; William Chun, Los Angeles; Ron P. Ruiz, Alhambra; Thomas I. Valdez, Covina, all of CA (US)

(73) Assignee: California Institute of Technology, Pasadena, CA (US)

( * ) Notice: Under 35 U.S.C. 154(b), the term of this patent shall be extended for 0 days.

(21) Appl. No.: 09/172,104

(22) Filed: Sep. 22, 1998

Related U.S. Application Data

(60) Provisional application No. 60/059,472, filed on Sep. 22, 1997.

(51) Int. Cl.[7] .................................................. H01M 11/00
(52) U.S. Cl. ................................ 429/41; 429/42; 429/44; 429/40; 204/290 R; 204/283; 204/192.14; 204/296
(58) Field of Search ........................... 204/290 R, 192.14, 204/283, 294, 296; 429/40, 41, 42, 44

(56) References Cited

U.S. PATENT DOCUMENTS

| | | | |
|---|---|---|---|
| 4,275,126 | 6/1981 | Bergmann et al. | 429/30 |
| 4,882,232 | 11/1989 | Bugnet et al. | 428/613 |
| 5,084,144 * | 1/1992 | Reddy et al. | 204/290 R |
| 5,242,764 | 9/1993 | Dhar | 429/30 |
| 5,277,996 | 1/1994 | Marchetti et al. | 429/44 |
| 5,512,152 | 4/1996 | Schicht et al. | 204/192.26 |
| 5,641,586 | 6/1997 | Wilson | 429/30 |
| 5,750,013 * | 5/1998 | Lin | 204/192.14 |

* cited by examiner

Primary Examiner—Bruce F. Bell
(74) Attorney, Agent, or Firm—Fish & Richardson P.C.

(57) ABSTRACT

A method for preparing a membrane for use in a fuel cell membrane electrode assembly includes the steps of providing an electrolyte membrane, and sputter-depositing a catalyst onto the electrolyte membrane. The sputter-deposited catalyst may be applied to multiple sides of the electrolyte membrane. A method for forming an electrode for use in a fuel cell membrane electrode assembly includes the steps of obtaining a catalyst, obtaining a backing, and sputter-depositing the catalyst onto the backing. The membranes and electrodes are useful for assembling fuel cells that include an anode electrode, a cathode electrode, a fuel supply, and an electrolyte membrane, wherein the electrolyte membrane includes a sputter-deposited catalyst, and the sputter-deposited catalyst is effective for sustaining a voltage across a membrane electrode assembly in the fuel cell.

61 Claims, 3 Drawing Sheets

SPUTTER-DEPOSITED FUEL CELL MEMBRANES AND ELECTRODES

CROSS REFERENCE TO RELATED APPLICATIONS

This patent application claims benefit of U.S. Provisional Application 60/059,472 filed Sep. 22, 1997.

STATEMENT AS TO FEDERALLY SPONSORED RESEARCH

The invention described herein was made in the performance of work under a NASA contact, and is subject to the provisions of Public Law 96-517 (35 U.S.C. § 202) in which the contractor has elected to retain title.

FIELD

The invention relates to chemical fuel cells. More particularly, the invention relates to sputter-depositing catalysts onto membranes and electrodes.

BACKGROUND

Chemical fuel cells utilize renewable resources and provide an alternative to burning fossil fuels to generate power. Fuel cells utilize the oxidation/reduction potentials of chemical reactions to produce electrical current.

For example, methanol is a known example of a renewable fuel source used in chemical fuel cells. In a methanol driven fuel cell, methanol and water is circulated past an anode that is separated from a cathode by a membrane that is selectively permeable to protons. The following chemical reaction takes place at the anode.

Anode: $CH_3OH + H_2O \rightarrow CO_2 + 6H^+ + 6e^-$

The protons generated at the anode pass through the membrane to the cathode side of the fuel cell. The electrons generated at the anode travel to the cathode side of the fuel cell by passing through an external load that connects the anode and cathode. Air or an alternative oxygen source is present at the cathode where the electro-reduction of oxygen occurs resulting in the following chemical reaction.

Cathode: $1.5O_2 + 6H^+ + 6e^- \rightarrow 3H_2O$

One of the important aspects of a chemical fuel cell is the membrane-electrode assembly (MEA). The MEA typically includes a selectively permeable polymer electrolyte membrane bonded between two electrodes, e.g., an anode electrode and a cathode electrode. Usually, both the anode and the cathode each contain a catalyst, often a noble metal. Known processes for fabricating high performance MEAs involve painting, spraying, screen-printing and/or hot-bonding catalyst layers onto the electrolyte membrane and/or the electrodes. These known methods can result in catalyst loading on the membrane and electrodes in the range from about 4 mg/cm$^2$ to about 12 mg/cm$^2$. Since noble metals such as platinum and ruthenium are extremely expensive, the catalyst cost can represent a large proportion of a fuel cell's total cost. Therefore, there exists a need for reducing the amount of deposited catalyst, and hence the cost.

SUMMARY OF THE INVENTION

In one aspect, the invention provides a method for preparing a membrane for use in a fuel cell membrane electrode assembly that includes the steps of providing an electrolyte membrane, and sputter-depositing a catalyst onto the electrolyte membrane. In one embodiment, the electrolyte membrane further includes at least a first side and a second side wherein the catalyst is applied to the first side and the second side of the electrolyte membrane.

In another embodiment, the sputter-deposited catalyst is sputter-deposited to an anode side, a cathode side, or both the anode and the cathode side of the electrolyte membrane.

The methods for preparing a membrane include depositing ranges of catalyst weights including catalyst weights of less than about 1.0 mg of catalyst per square centimeter of the electrolyte membrane, catalyst weights of less than about 0.05 mg of catalyst per square centimeter of electrolyte membrane, and catalyst weights ranging from about 0.05 mg of catalyst per square centimeter of the electrolyte membrane to about 1.0 mg of catalyst per square centimeter of the electrolyte membrane.

In another embodiment, the catalysts used in the methods for preparing a membrane include the transition metals. Further, the catalysts include mixtures of two or more catalysts, catalyst alloys and/or oxides thereof. The catalysts can be selected from Pt, Ru, Ni, Ti, Zr, Sn, SnO$_2$, Os, Ir, W, WO$_3$, Pd, Mo, Nb, RuO$_2$, and Re.

In another embodiment, the catalysts are sputter-deposited as layers. Two or more catalysts may be sputter-deposited at the same time.

In another embodiment, the electrolyte membrane further includes a first side and a second side wherein the catalyst further includes two or more catalysts, and wherein the two or more catalysts are sputter-deposited to at least one side of the electrolyte membrane.

In a second aspect, the invention provides a method for forming an electrode for use in a fuel cell membrane electrode assembly that includes the steps of obtaining a catalyst, obtaining a backing, and sputter-depositing the catalyst onto the backing. In one embodiment, the backing is carbon paper. In other embodiments, the electrode is an anode or a cathode.

The methods for preparing an electrode include depositing ranges of catalyst weights including catalyst weights of less than about 1.0 mg of catalyst per square centimeter of the backing, catalyst weights of less than about 0.05 mg of catalyst per square centimeter of backing, and catalyst weights ranging from about 0.05 mg of catalyst per square centimeter of the backing to about 1.0 mg of catalyst per square centimeter of the backing.

In another embodiment, the catalysts used in the methods for preparing an electrode include the transition metals. Further, the catalysts include mixtures of two or more catalysts, catalyst alloys and/or oxides thereof. The catalysts can be selected from Pt, Ru, Ni, Ti, Zr, Sn, SnO$_2$, Os, Ir, W, WO$_3$, Pd, Mo, Nb, RuO$_2$, and Re.

In another embodiment, the catalysts are sputter-deposited as layers. Further, two or more catalysts may be sputter-deposited at the same time.

In a third aspect, the invention provides a fuel cell that includes an anode electrode, a cathode electrode, a fuel supply, and an electrolyte membrane, wherein the electrolyte membrane includes a sputter-deposited catalyst, and the sputter-deposited catalyst is effective for sustaining a voltage across a membrane electrode assembly in the fuel cell.

In other embodiments, the catalyst is sputter-deposited to an anode side, a cathode side or both the anode side and the cathode side of the electrolyte membrane.

In another embodiment, the fuel cell has various sputter-deposited catalyst weight ranges including catalyst weights that are less than about 1.0 mg of catalyst per square centimeter of the electrolyte membrane, less than about 0.05 mg of catalyst per square centimeter of the electrolyte membrane, and/or range from about 0.05 mg of catalyst per square centimeter of the electrolyte membrane to about 1.0 mg of catalyst per square centimeter of the electrolyte membrane. In another embodiment, the catalyst weights are found on the anode side of the electrolyte membrane, or the cathode side of the electrolyte membrane, or both the anode side and the cathode side of the electrolyte membrane.

In another embodiment, the catalysts used in the fuel cell include the transition metals. Further, the catalysts include mixtures of two or more catalysts, catalyst alloys and/or oxides thereof. The catalysts can be selected from Pt, Ru, Ni, Ti, Zr, Sn, $SnO_2$, Os, Ir, W, $WO_3$, Pd, Mo, Nb, $RuO_2$, and Re.

In another embodiment, the catalysts are sputter-deposited as layers. Two or more catalysts may be sputter-deposited at the same time.

In another embodiment, the electrolyte membrane of the fuel cell includes a first side and a second side, wherein the catalyst further includes two or more catalysts, and wherein the two or more catalysts are sputter-deposited to at least one side of the electrolyte membrane.

In another embodiment, the fuel cells are fabricated as methanol fuel cells or hydrogen fuel cells.

Unless otherwise defined, all technical and scientific terms and abbreviations used herein have the same meaning as commonly understood by one of ordinary skill in the art to which this invention pertains. In case of conflict, the present specification, including definitions, will control. Other features and advantages of the invention will be apparent from the following description of the preferred embodiments and from the claims.

BRIEF DESCRIPTION OF THE DRAWINGS

Like reference numbers denote similar items.

DESCRIPTION OF THE PREFERRED EMBODIMENTS

This embodiment involves preparing polymer membranes and electrodes for fabrication into membrane electrode assemblies (MEAs) for use in chemical fuel cells. In particular, the embodiment provides fuel cells and methods for preparing membranes and electrodes that utilize catalysts that are sputter-deposited onto the membranes and/or electrodes.

An illustrative method for sputter-depositing a catalyst onto polymer electrolyte membrane includes the following steps. A suitable electrolyte polymer that has a low permeability for a fuel source, ionic conductivity and good electrochemical stability is cast into a membrane and hydrated for fabrication into a MEA using known methods. Useful polymers include co-polymers of tetrafluoroethylene and perfluoropolyether sulfonic acid such as the membrane materials sold under the trademark NAFION (™), perfluorinated sulfonic acid polymers such as the materials sold under the trademark ACIPLEX (™), polyethylene sulfonic acid polymers, polypropylene sulfonic acid polymers, polystyrene sulfonic acid polymers, polyketone sulfonic acids, polybenzimidazole doped with phosphoric acid, sulfonated polyether sulfones, and other polyhydrocarbon-based sulfonic acid polymers. Further, the electrolyte membranes further include polymer composites or blends. An illustrative method for preparing a polymer electrolyte membrane, such as NAFION (™), is disclosed in U.S. Pat. No. 5,773,162, which is hereby incorporated by reference in its entirety.

A hydrated electrolyte membrane is prepared for receiving a sputter-deposited catalyst by air drying the hydrated electrolyte membrane for about 24 hours and then vacuum drying the membrane for an additional 30–60 minutes.

The process of sputtering materials onto a substrate and the use of sputter-deposition chambers are known. Any type of sputter deposition method may be used. Briefly, a sputter-deposition chamber typically operates by using a voltage differential to dislodge particles from a target material that then attach to a substrate forming a coating of the target material on the substrate material.

Figure 1:
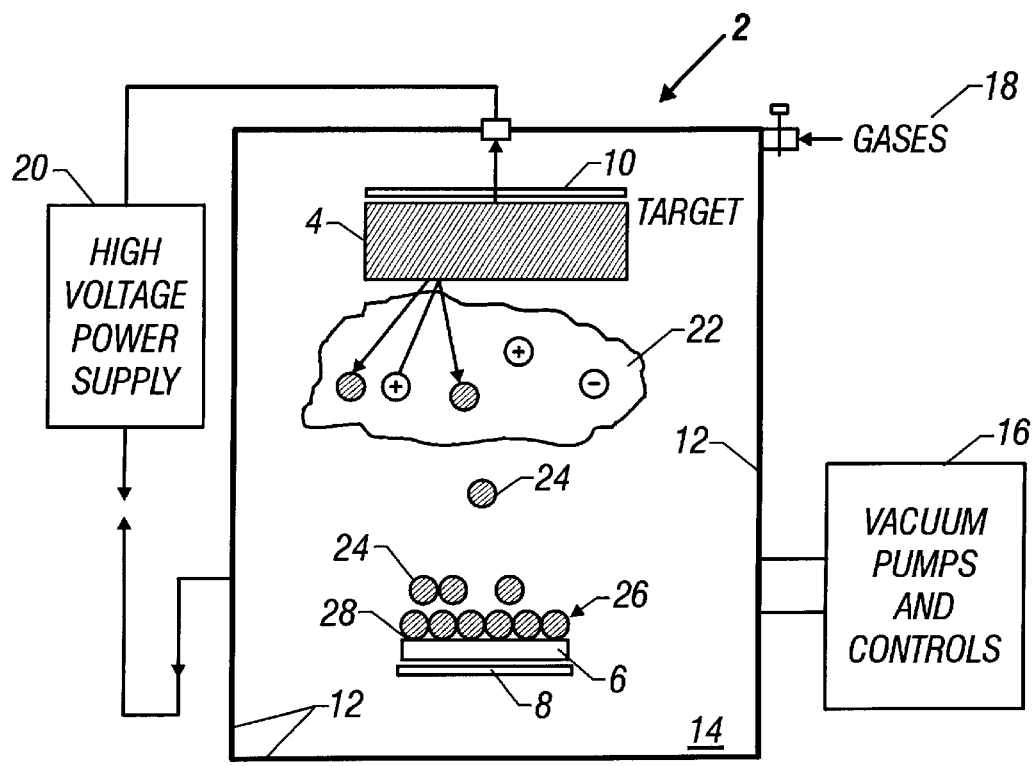
FIG. 1 is a block diagram depicting a sputter-deposition chamber.

FIG. 1 depicts a block diagram of a sputter-deposition chamber 2 that sputter-deposits a target 4 onto a substrate 6. A substrate holder 8 secures the substrate 6 within the chamber 2 between a target holder 10 and a chamber wall 12. Substrate 6 includes any material upon which sputter-deposition of a target 4 is sought. For example, a vacuum-dried electrolyte membrane such as a membrane fabricated using a NAFION (™) polymer is a useful substrate 6. It is to be understood that the sputter-deposition chamber 2 also includes multiple substrates 6 in one chamber 2.

The target holder 10 secures a target 4 within the chamber 2. Although FIG. 1 depicts a single target holder 10 and target 4, it is to be understood that multiple target holders 10 and targets 4 can be disposed within the sputter-deposition chamber. Multiple target holders 10 are used to simultaneously sputter-deposit multiple target 4 materials onto at least one substrate 6. Target 4 materials include mixtures of materials, e.g., metal alloys, that serve to sputter-deposit multiple target 4 materials onto at least one substrate 6. Useful targets 4 for preparing MEAs include catalysts used in chemical fuel cells. Useful catalysts include the transition metals, e.g., nickel (Ni), titanium (Ti), zirconium (Zr), tin (Sn), tin oxides such as $SnO_2$, molybdenum (Mo), ruthenium (Ru), ruthenium oxides such as $RuO_2$, platinum (Pt), palladium (Pd), niobium (Nb), osmium (Os), iridium (Ir), tungsten (W), tungsten oxides such as $WO_3$, rhenium (Re), alloys thereof, and other similar materials. Further, target 4 materials include any type of composition including single, binary, ternary, and quaternary compositions of individual target 4 materials.

After the target 4 and substrate 6 are secured, the chamber space 14 is evacuated using a vacuum pump and controls 16 and then filled with a gas 18. Gas 18 includes inert gases such as argon, reactive gases, or mixtures of inert gases and reactive gases. Useful gas 18 pressures inside the chamber space 14 range from about 5 millitorr to about 100 millitorr. The gas 18 pressure affects the deposition rate of the target 4 and the energy of the sputtered atoms or material that reach the substrate 6.

A sputter-deposition process for contacting the target 4 onto the substrate 6 is initiated using a power supply 20 to apply a voltage differential between the target 4 and the chamber wall 12. Useful voltages for sputter-depositing catalysts range from about 50 volts (V) to about 2 kilovolts (KV). The voltage differential charges the target 4 and holds the target 4 at a positive potential. The voltage differential also ionizes the gas 18. As the voltage differential increases, a plasma 22 (the charged target/plasma being conceptually illustrated by reference numeral 22) forms on the target 4 as a result of a flux of the high-energy ions bombarding the target 4 surface. The high-energy ions eject or sputter atoms 24 from the target 4. The dislodged atoms 24 may be charged or uncharged. Some of these dislodged atoms 24 contact the substrate 6 and attach thereto. Thus, the atoms 24 form a coating 26 disposed about an exposed surface 28 of the substrate 6. It is to be understood that the coating 26 can attain multiple morphologies (described in detail below) that are dependent upon the sputter-deposition conditions used. After the sputter-deposition process is complete, the power supply 20 is turned off and the chamber space 14 is returned to ambient pressure. At this point, the now sputter-coated substrate 6 is removed. Radiofrequency magnetrons will also generate a useful plasma 22 that will sputter-deposit atoms 24.

It is to be understood that the substrate 6 may be coated on more than one surface and that each surface may be coated with alternative target 4 materials. For example, electrolyte membranes used for constructing MEAs typically have at least two surfaces that are referred to as an eventual anode side of the membrane and an eventual cathode side of the membrane. It can be advantageous to sputter-deposit different targets 4 on the eventual anode side and the eventual cathode side of the membrane. A preferred example of such an sputter-coated electrolyte membrane having different catalysts on the eventual anode side and the eventual cathode side is a NAFION (™)-based membrane sputter-coated on the eventual anode side of the membrane with platinum and ruthenium and sputter-coated on the eventual cathode side of the membrane with Platinum. Alternatively, some membranes, e.g., membranes for use in $H_2$/air fuel cells, may incorporate identical substrates 6 on each side.

The coating 26 morphology includes the microscopic and macroscopic appearance of the coating 26 as well as the sputter-deposited coating 26 thickness. The sputter-deposited coating morphology is affected by numerous parameters including the voltage differential, the chamber space 14 pressure, the length of the sputter-deposition process, the substrate 6 material, and the target 4 material. Changing the sputter-deposition conditions such as the sputter rate, chamber pressure, and voltage influence the coating 26 grain size, composition, crystallinity, porosity, and surface area. Typically, high gas pressures lead to more porous deposits and low pressures result in compact fine grained sputter-coatings 26. Also, fine-grained sputter-coatings 26 can occur when using high deposition rates. Lower deposition rates favor large and porous coatings 26. Increased voltages increase target deposition rates and tend to produce more fine-grained deposits. Coating morphologies are also affected by the gas 18 pressure. The optimum conditions will vary according to the target 4 and the desired coating 26 morphology and should be determined empirically.

Alternative morphologies are achieved by selecting different target 4 materials and/or altering the sequence of sputter-depositing the target 4 materials. For example, using platinum as the target 4 results in a different coating than a mixture or alloy of platinum and ruthenium. Additionally, sputter-depositing platinum and ruthenium concurrently from two different target 4 sources results in a different coating than sputter-depositing platinum and ruthenium in a sequential fashion. For example, platinum and ruthenium sources placed concurrently in the same sputter-deposition chamber 2 and used as multiple targets 4 will deposit platinum and ruthenium as a composite coating 26. Alternatively, a substrate 6 sputter-deposited with a first platinum target 4 material and then further sputter-deposited with a second ruthenium target 4 material leads to layers of platinum and ruthenium. Altering the morphology and the sputter-deposited coating thickness will alter MEA performance characteristics.

Preferably, the sputter-deposition process results in a sputter-deposited coating weight or loading that ranges from about 0.05 mg of the target 4 per square centimeter of exposed substrate surface 28 to about 1.0 mg of target 4 per square centimeter of exposed substrate surface 28. Other sputter-deposited coating weights or loads include less than about 0.05 mg of the target 4 per square centimeter of exposed substrate surface 28, less than about 0.1 mg of the target 4 per square centimeter of exposed substrate surface 28, less than about 0.5 mg of the target 4 per square centimeter of exposed substrate surface 28, and less than about 0.7 mg of the target 4 per square centimeter of exposed substrate surface 28. Excessive coating 26 weights result in thicker coatings that decrease fuel cell performance. Therefore, coatings 26 less than about 1.0 mg of target 4 per square centimeter of exposed substrate surface 28 are desirable. Typically, effective catalyst layers or coatings are achieved by allowing the sputter-deposition process to proceed from about 1000 seconds to about 10,000 seconds at a voltage differential from about 50 V to about 2 KV at a pressure from about 2 millitorr to about 200 millitorr.

The sputter-deposited coating 26 thickness can be determined using any method, including using scanning electron microscope methods and/or a Rutherford back scattering spectrophotometer methods. An illustrative method for determining the sputter-deposited coating thickness includes weighing the substrate 6 before and after the sputter-deposition process. The substrate 6 weight increase will correspond to the weight of the sputter-deposited target 4. The surface area of the substrate 6 is determined by computing the surface area of the substrate 6 that was exposed to sputter-deposition in the sputter-depositing chamber 2. The density of the target 4 material is then used to estimate coating 26 thickness.

Targets 4 may be sputter-deposited onto an anode carrier, a cathode carrier, carbon paper, or other suitable material. The resulting sputter-coated carrier or paper materials are used to fabricate MEAs. Carrier materials useful for fabricating anodes and cathodes and methods for preparing the carrier materials, including methods to alter the wettability of the carriers, are known. To use the methods described herein to prepare an electrode, a suitable carrier such as carbon paper is suitably secured to the substrate holder 8. Once secured, the suitable carrier is sputter-coated using any of the target 4 materials disclosed herein by following the methods described for sputter-coating electrolyte membranes. For example, if an anode is being constructed, the target 4 material should contain catalysts appropriate for the anode such as a platinum-ruthenium alloy. Alternatively, if a cathode surface is being produced, the target 4 material should contain catalysts appropriate for the cathode such as platinum. Other useful target materials include Ni, Ti, Zr, Sn, $SnO_2$, Ru, Pt, Os, Ir, W, $WO_3$, Re, Pd, Mo, Nb, $RuO_2$, alloys thereof, and other similar materials.

Sputter-coated membranes, anode carriers, cathode carriers, carbon paper, and other suitable sputter-coated materials are fabricated into membrane electrode assemblies (MEA) for use in fuel cells. For example, electrolyte membranes such as NAFION (™) are sputter-coated with a catalyst on one or more sides. The sputter-coated membrane is bonded or suitably secured to an anode and a cathode. Bonding methods include known hot-pressing techniques. The anode and/or cathode can also be prepared using the above-described sputter-depositing method before being assembled into a MEA. Alternatively, the anode and/or cathode are prepared by conventional painting, spraying, or other methods. Additionally, the anode and/or cathode may be constructed from a noncatalytic conductive material such as gold. An MEA is then assembled into a fuel cell or fuel cell test fixture, which is useful for evaluating MEA performance.

The membranes, electrodes and methods disclosed herein may work in any type of fuel cells including polymer electrolyte fuel cells, phosphoric acid fuel cells, alkaline fuel cells, molten-carbonate fuel cells, and solid oxide fuel cells by sputter-depositing using known catalysts and known membranes. For example, the methods disclosed herein are useful for preparing MEAs used in methanol fuel cells and hydrogen fuel cells.

EXAMPLE 1

Evaluating Fuel Cells Using Sputter-Deposited Anodes

NAFION (™) 117 was cast into a membrane using known methods. The hydrated membrane was allowed to air dry for 24 hours and then vacuum dried from about 8 to about 24 hours. The vacuum-dried membrane was weighed and secured in a substrate holder of a sputter-deposition chamber with the eventual anode side of the membrane being exposed. A platinum-ruthenium target source was secured to a target holder. The sputter-depositing chamber was evacuated and pressurized with 10–15 millitorr of argon gas. The membrane was sputter-deposited for 1000 seconds with a voltage differential of 1 KV. The membrane was then re-weighed. The sputter-coating was 0.5 mg/cm$^2$ of the anode side of the membrane.

A carbon paper carrier was secured in the sputter-depositing chamber as described above. The carrier was coated with 0.5 mg/cm$^2$ of the platinum-ruthenium target source according to the methods used above to coat the membrane. A cathode electrode was assembled using known techniques.

The membrane and electrodes were then assembled into a membrane electrode assembly for use in a direct methanol fuel cell test fixture using known hot-pressing techniques at 140–150° C.

Figure 2:
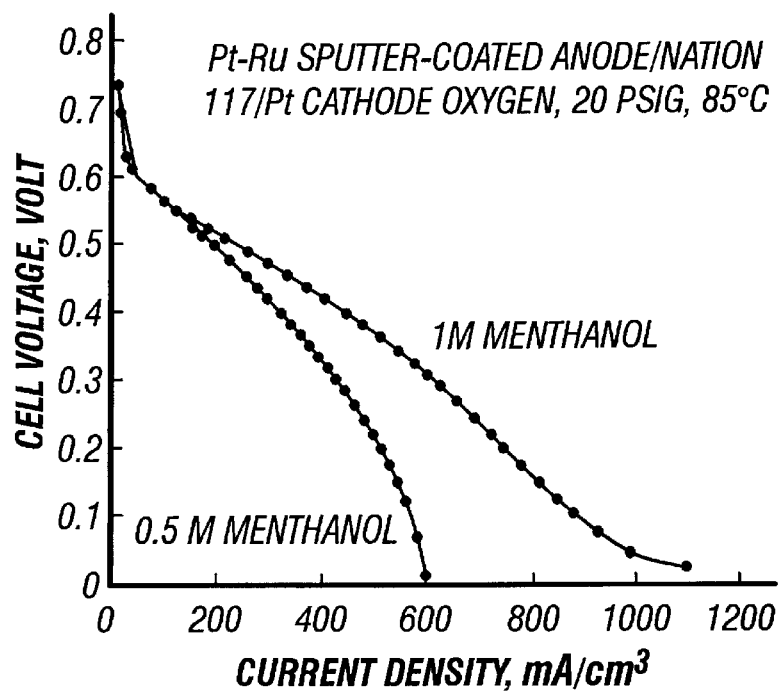
FIG. 2 is a graph depicting the performance of direct methanol fuel cells using sputter-deposited anodes.

FIG. 2 depicts the results of the electrical performance of the fuel cell test fixture in a 0.5 M methanol fuel source and a 1.0 M methanol fuel cell. Each fuel cell was run under an external load held at a constant current, 20 psig oxygen concentration, at 85° C.

EXAMPLE 2

Evaluating Sputter-Deposited Catalyst Materials

Membranes, electrodes, and a fuel cell test fixture were fabricated as indicated in Example 1. Platinum and platinum/ruthenium target sources were used to prepare a platinum anode and a platinum/ruthenium anode, respectively.

Figure 3:
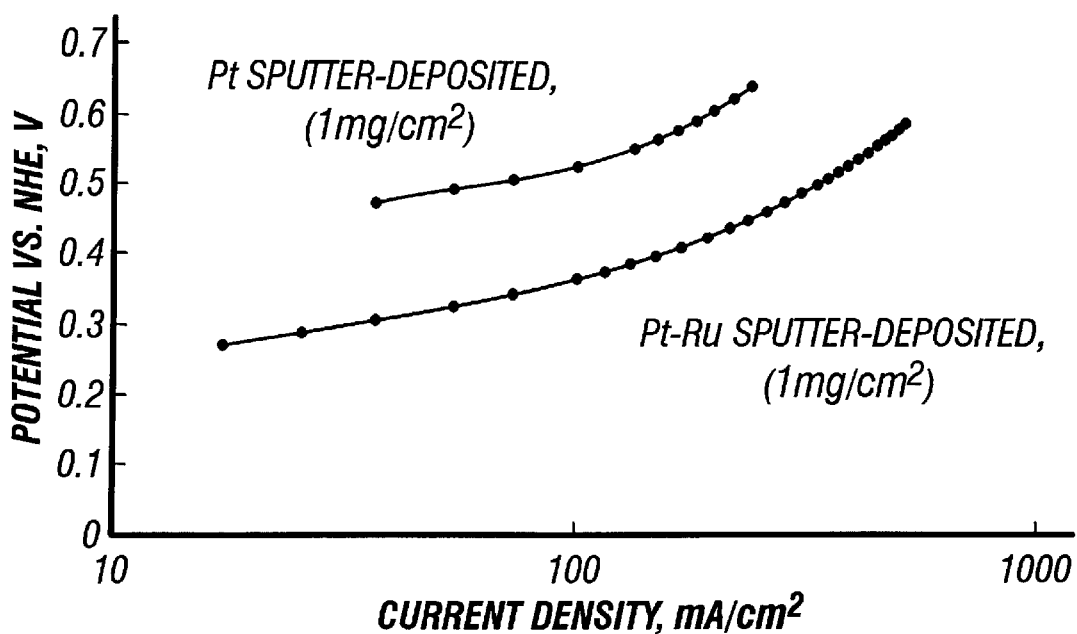
FIG. 3 is a graph depicting the anode polarization behavior of sputter-deposited Pt—Ru and Pt electrodes.

The fuel cell fixtures were used to evaluate the two anodes. Anodes were evaluated using known methods. FIG. 3 depicts the differences in the polarization characteristics of platinum and platinum/ruthenium sputter-deposited anode electrodes deposited at 1 mg/cm$^2$, i.e., 0.5 mg/cm$^2$ deposited on the membrane and 0.5 mg/cm$^2$ deposited on the anode.

EXAMPLE 3

Comparing Sputter-Deposited Electrodes and Conventional Electrodes

Sputter-deposited membranes, electrodes, and a fuel cell test fixture were fabricated as indicated in Example 1. The sputter-deposition resulted in the platinum/ruthenium target being deposited at 1 mg/cm$^2$ for the anode side, i.e., 0.5 mg/cm$^2$ deposited on the membrane and 0.5 mg/cm$^2$ deposited on the anode. A fuel cell test fixture was also fabricated from membranes and electrodes fabricated using conventional catalyst painting techniques to apply a platinum/ruthenium catalyst to an anode electrode. The conventional anode electrode had a catalyst ink applied at 8 mg/cm$^2$.

Figure 4:
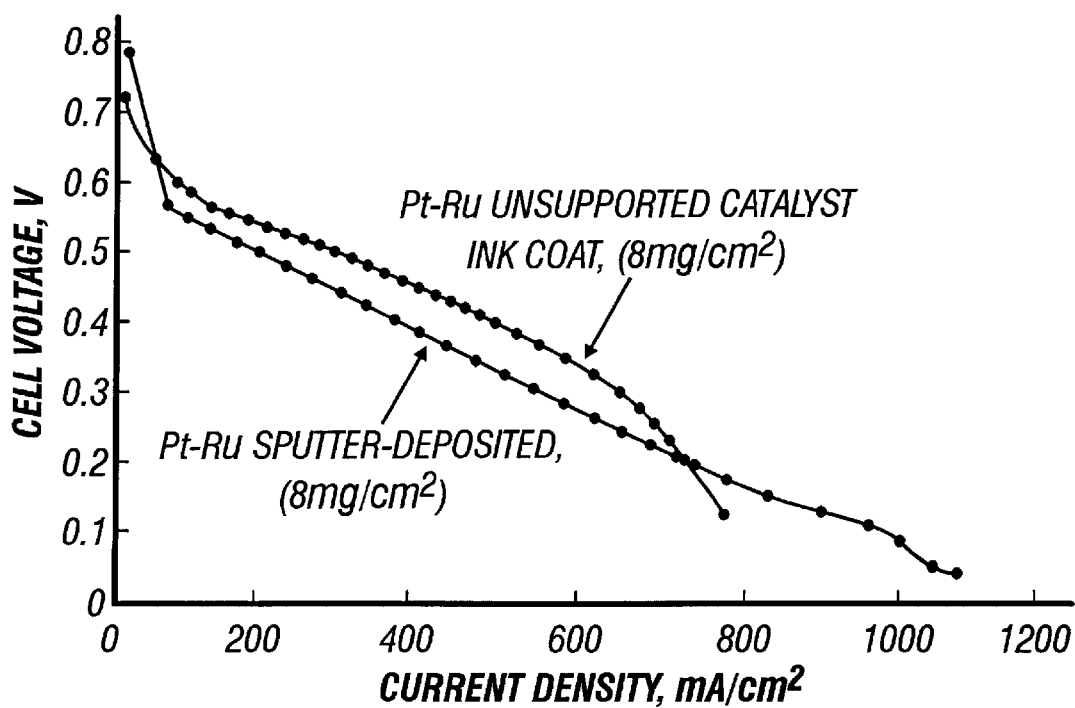
FIG. 4 is a graph depicting a comparison between sputter-deposited anodes and conventional anodes.

The membrane electrode assemblies were assembled into conventional methanol fuel cell test fixtures. The fuel cells were compared at different constant currents using a 1 M methanol fuel source, 20 psig oxygen at 85° C. FIG. 4 depicts the comparison of the sputter-coated and conventional electrode performance in the fuel cells.

EXAMPLE 4

Computing Catalyst Utilization For Different Catalyst Layers

Figure 5:
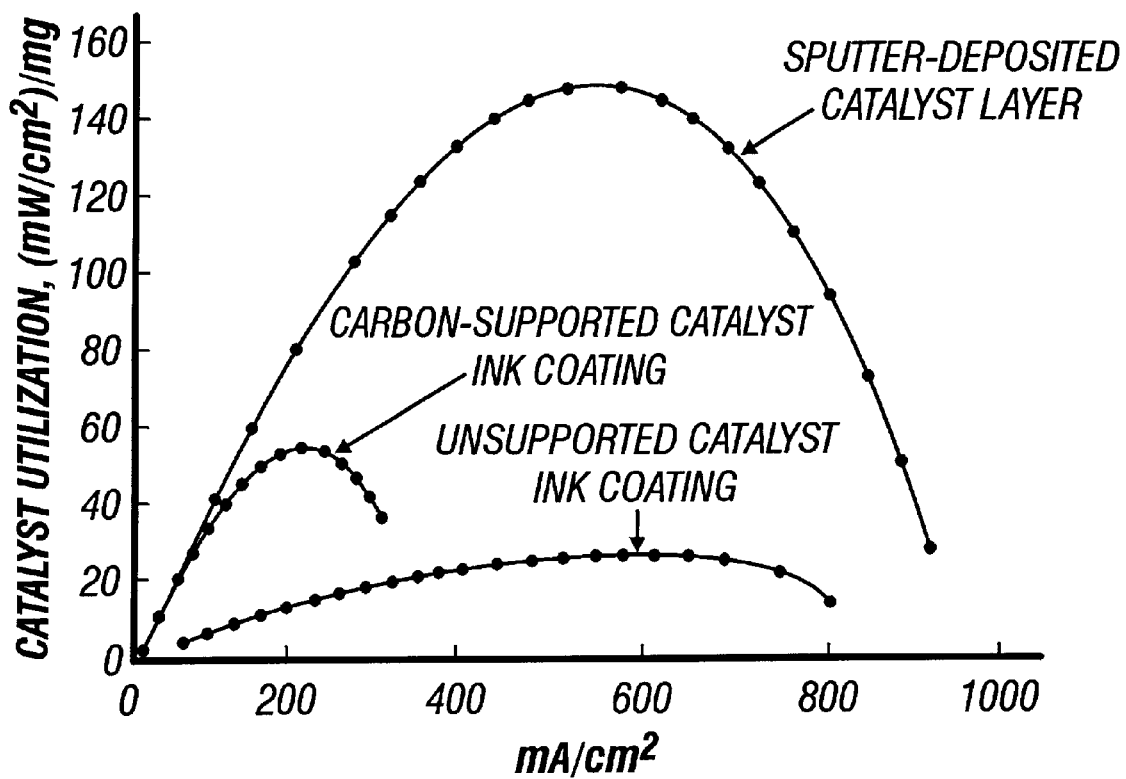
FIG. 5 is graph depicting the catalyst utilization for various types of catalyst layers.

Catalyst utilization for the catalyst coating methods were computed and compared. FIG. 5 depicts a catalyst utilization curve for sputter-deposited catalyst layers, carbon-supported catalyst ink coatings, and unsupported catalyst ink coatings. Referring to FIG. 5, sputter-deposited catalysts result in good electrical performance and the highest power density per milligram of catalyst used, which represents the highest catalyst utilization. A fuel cell voltage of 0.45 V at 300 mA/cm$^2$ and current densities as high as 1 A/cm$^2$ can be sustained with fuel cells having sputter-deposited catalysts.

Other aspects, advantages, and modifications are within the scope of the following claims.

What is claimed is:

1. A method for preparing a membrane for use in a fuel cell membrane electrode assembly comprising the steps of:
   casting an electrolyte polymer into a membrane, wherein the membrane has an eventual anode side and an eventual cathode side; and
   sputter-depositing at least one catalyst onto at least one of the eventual anode side and the eventual cathode side of said electrolyte membrane.

2. The method of claim 1, wherein said sputter depositing of said catalyst results in a sputter-deposited catalyst weight of less than about 1.0 mg of catalyst per square centimeter of said electrolyte membrane.

3. The method of claim 1, wherein said sputter depositing of said catalyst results in a sputter-deposited catalyst weight of less than 0.05 mg of catalyst per square centimeter of electrolyte membrane.

4. The method of claim 1, wherein said sputter depositing of said catalyst results in a sputter-deposited catalyst weight from about 0.05 mg of catalyst per square centimeter of said electrolyte membrane to about 1.0 mg of catalyst per square centimeter of said electrolyte membrane.

5. The method of claim 1, wherein said catalyst is sputter-deposited to the eventual anode side of said electrolyte membrane.

6. The method of claim 5, wherein said sputter depositing of said catalyst results in a sputter-deposited catalyst weight from about 0.05 mg of catalyst per square centimeter of said anode side of said electrolyte membrane to about 1.0 mg of catalyst per square centimeter of said anode side of said electrolyte membrane.

7. The method of claim 1, wherein said catalyst is sputter-deposited to the eventual cathode side of said electrolyte membrane.

8. The method of claim 7, wherein said sputter depositing of said catalyst results in a sputter-deposited catalyst weight from about 0.05 mg of catalyst per square centimeter of said cathode side of said electrolyte membrane to about 1.0 mg of catalyst per square centimeter of said cathode side of said electrolyte membrane.

9. The method of claim 1, wherein said catalyst is sputter-deposited to the eventual anode side of said electrolyte membrane and said catalyst is sputter-deposited to the eventual cathode side of said electrolyte membrane.

10. The method of claim 9, wherein said sputter depositing of said catalyst results in a sputter-deposited catalyst weight from about 0.05 mg per square centimeter of said electrolyte membrane to about 1.0 mg per square centimeter of said electrolyte membrane.

11. The method of claim 1, wherein said catalyst comprises a transition metal.

12. The method of claim 1, wherein said catalyst is selected from the group consisting of Pt, Ru, Ni, Ti, Zr, Sn, $SnO_2$, Os, Ir, W, $WO_3$, Pd, Mo, Nb, $RuO_2$, and Re.

13. The method of claim 1, wherein said catalyst is sputter-deposited from an alloy.

14. The method of claim 1, wherein said catalyst further comprises two or more catalysts.

15. The method of claim 14, wherein said catalysts comprise transition metals.

16. The method of claim 14, wherein said catalysts are selected from the group consisting of Pt, Ru, Ni, Ti, Zr, Sn, $SnO_2$, Os, Ir, W, $WO_3$, Pd, Mo, Nb, $RuO_2$, and Re.

17. The method of claim 14, wherein said two or more catalysts are sputter-deposited from an alloy.

18. The method of claim 14, wherein said two or more catalysts are sputter-deposited as layers.

19. The method of claim 14, wherein said two or more catalysts are sputter-deposited at the same time.

20. The method of claim 1, wherein a first catalyst is sputter-deposited on the eventual anode side of the electrolyte membrane and a second catalyst is sputter-deposited on the eventual cathode side of the electrolyte membrane, and the first catalyst differs from the second catalyst.

21. A method for forming an electrode for use in a fuel cell membrane electrode assembly comprising the steps of:
   obtaining a catalyst;
   obtaining a backing that includes multiple sides; and
   sputter-depositing said catalyst onto said multiple sides of said backing.

22. The method of claim 21, wherein said backing comprises carbon paper.

23. The method of claim 21, wherein said sputter depositing of said catalyst results in a sputter-deposited catalyst weight of less than about 1.0 mg of catalyst per square centimeter of said backing.

24. The method of claim 21, wherein said sputter depositing of said catalyst results in a sputter-deposited catalyst weight of less than 0.05 mg of catalyst per square centimeter of backing.

25. The method of claim 21, wherein said sputter depositing of said catalyst results in a sputter-deposited catalyst weight from about 0.05 mg of catalyst per square centimeter of said backing to about 1.0 mg of catalyst per square centimeter of said backing.

26. The method of claim 21, wherein said catalyst is sputter-deposited to an anode electrode.

27. The method of claim 21, wherein said catalyst is sputter-deposited to a cathode electrode.

28. The method of claim 21, wherein said catalyst comprises a transition metal.

29. The method of claim 21, wherein said catalyst is selected from said group consisting of Pt, Ru, Ni, Ti, Zr, Sn, $SnO_2$, Os, Ir, W, $WO_3$, and Re.

30. The method of claim 21, wherein said catalyst is sputter-deposited from an alloy.

31. The method of claim 21, wherein said catalyst further comprises two or more catalysts.

32. The method of claim 31, wherein said catalysts comprise transition metals.

33. The method of claim 31, wherein said catalysts are selected from said group consisting of Pt, Ru, Ni, Ti, Zr, Sn, $SnO_2$, Os, Ir, W, $WO_3$, and Re.

34. The method of claim 31, wherein said two or more catalysts are sputter-deposited from an alloy.

35. The method of claim 31, wherein said two or more catalysts are sputter-deposited as layers.

36. The method of claim 31, wherein said two or more catalysts are sputter-deposited at the same time.

37. A fuel cell comprising:
   an anode electrode;
   a cathode electrode;
   a fuel supply; and
   an electrolyte membrane comprising a cast electrolyte polymer, wherein said membrane has a first side adjacent the anode electrode and a second side adjacent the cathode electrode, and wherein said electrolyte membrane further comprises a sputter-deposited catalyst on at least one of the first and second sides thereof, said sputter-deposited catalyst having a porosity effective for sustaining a voltage and gas flow across a membrane electrode assembly in said fuel cell.

38. The fuel cell of claim 37, wherein said sputter-deposited catalyst weight is less than about 1.0 mg of catalyst per square centimeter of said electrolyte membrane.

39. The fuel cell of claim 37, wherein said sputter-deposited catalyst weight is less than 0.05 mg of catalyst per square centimeter of said electrolyte membrane.

40. The fuel cell of claim 37, wherein said sputter-deposited catalyst weight is from about 0.05 mg of catalyst per square centimeter of said electrolyte membrane to about 1.0 mg of catalyst per square centimeter of said electrolyte membrane.

41. The fuel cell of claim 37, wherein said catalyst is sputter-deposited to the first side of said electrolyte membrane.

42. The fuel cell of claim 41, wherein said sputter depositing of said catalyst results in a sputter-deposited catalyst weight from about 0.05 mg of catalyst per square centimeter of said first side of said electrolyte membrane to about 1.0 mg of catalyst per square centimeter of said first side of said electrolyte membrane.

43. The fuel cell of claim 37, wherein said catalyst is sputter-deposited to the second side of said electrolyte membrane.

44. The fuel cell of claim 43, wherein said sputter depositing of said catalyst results in a sputter-deposited catalyst weight from about 0.05 mg of catalyst per square centimeter of said second side of said electrolyte membrane to about 1.0 mg of catalyst per square centimeter of said second side of said electrolyte membrane.

45. The fuel cell of claim 37, wherein said catalyst is sputter-deposited to the first side of said electrolyte membrane and said catalyst is sputter-deposited to the second side of said electrolyte membrane.

46. The fuel cell of claim 37, wherein said catalyst comprises a transition metal.

47. The fuel cell of claim 46, wherein said catalyst is selected from the group consisting of Pt, Ru, Ni, Ti, Zr, Sn, $SnO_2$, Os, Ir, W, $WO_3$, and Re.

48. The fuel cell of claim 37, wherein said catalyst is sputter-deposited from an alloy.

49. The fuel cell of claim 37, wherein said catalyst further comprises two or more catalysts.

50. The fuel cell of claim 49, wherein said catalysts comprise transition metals.

51. The fuel cell of claim 49, wherein said catalysts are selected from the group consisting of Pt, Ru, Ni, Ti, Zr, Sn, $SnO_2$, Os, Ir, W, $WO_3$, and Re.

52. The fuel cell of claim 49, wherein said two or more catalysts are sputter-deposited from an alloy.

53. The fuel cell of claim 49, wherein said two or more catalysts are sputter-deposited as layers.

54. The fuel cell of claim 49, wherein said two or more catalysts are sputter-deposited at the same time.

55. The fuel cell of claim 37, said anode electrode further comprising a sputter-deposited catalyst.

56. The fuel cell of claim 37, said cathode electrode further comprising a sputter-deposited catalyst.

57. The fuel cell of claim 37, wherein said fuel cell comprises a methanol fuel cell.

58. The fuel cell of claim 37, wherein said fuel cell comprises a hydrogen fuel cell.

59. A method for making a membrane electrode assembly, comprising:

casting an electrolyte polymer into a membrane, wherein the membrane has an eventual anode side and an eventual cathode side;

sputter-depositing at least one catalyst onto at least one of the eventual anode side and the eventual cathode side of said electrolyte membrane bonding an anode to the eventual anode side of the membrane and a cathode to the eventual cathode side of the membrane.

60. The method of claim 59, wherein at least one of the anode and the cathode are made by:

obtaining a catalyst;

obtaining a backing; and sputter-depositing said catalyst onto said backing.

61. The method of claim 59, wherein a first catalyst is sputter-deposited on the eventual anode side of the electrolyte membrane and a second catalyst is sputter-deposited on the eventual cathode side of the electrolyte membrane, and the first catalyst differs from the second catalyst.

* * * * *